United States Patent [19]

Ward et al.

[11] 4,145,760

[45] Mar. 20, 1979

[54] MEMORY DEVICE HAVING A REDUCED NUMBER OF PINS

[75] Inventors: William P. Ward; Donald K. Lauffer, both of Poway, Calif.

[73] Assignee: NCR Corporation, Dayton, Ohio

[21] Appl. No.: 895,328

[22] Filed: Apr. 11, 1978

[51] Int. Cl.² ............................................. G11C 13/00
[52] U.S. Cl. .................................... 365/226; 365/191; 365/229
[58] Field of Search ................. 365/51, 191, 206, 226, 365/227, 229

[56] References Cited

U.S. PATENT DOCUMENTS 4,044,339  8/1977  Berg .................................. 340/173 R Primary Examiner—Terrell W. Fears Attorney, Agent, or Firm—J. T. Cavender; Edward Dugas; Stephen F. Jewett

[57] ABSTRACT

A memory device includes a circuit for reducing the number of pins or external terminals on the memory device. A threshold detector within the circuit detects the difference in voltage between signals applied at two external pins. A clocking signal at one pin provides, in addition to a synchronizing function, a memory device select function, and a signal at the other pin provides memory mode select as well as memory address, data input and data output functions. Switching transistors controlled by the output of the threshold detector connect the external pins to the power and ground terminals of an internal power supply so that the signals at the two external pins also provide the power and ground signals to the memory device.

12 Claims, 5 Drawing Figures

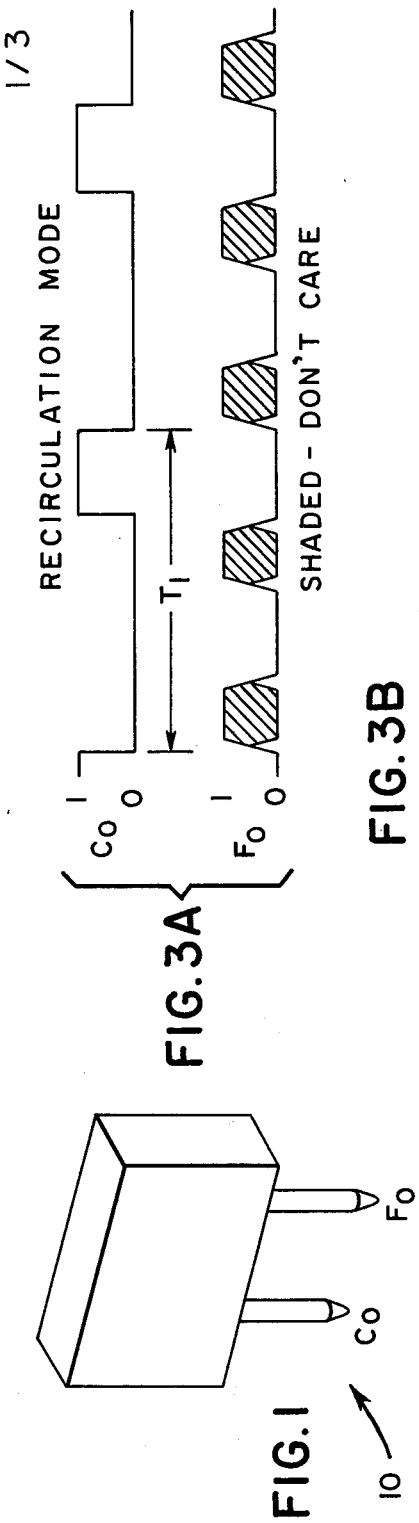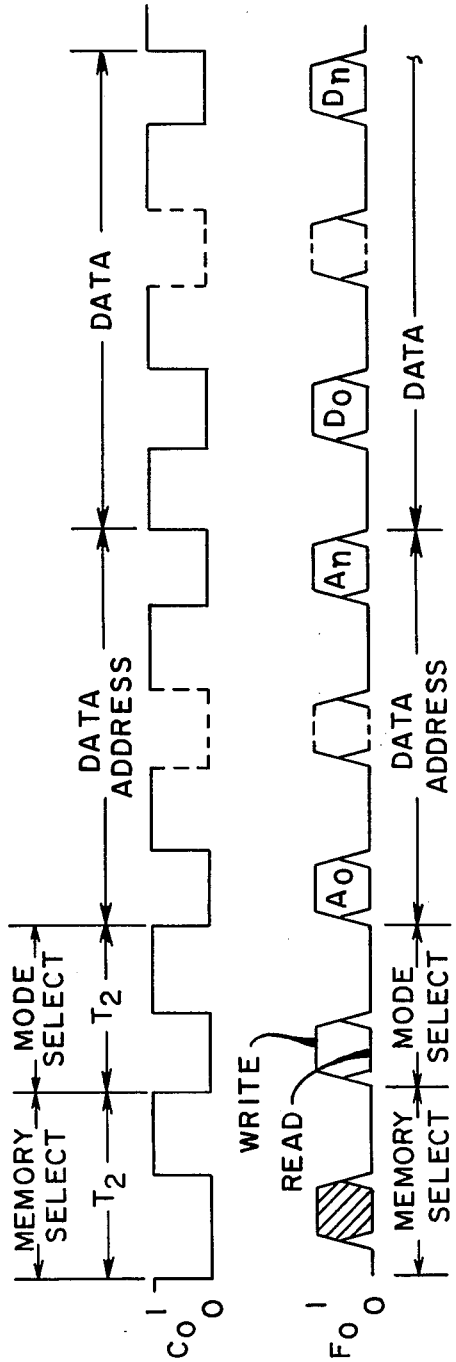

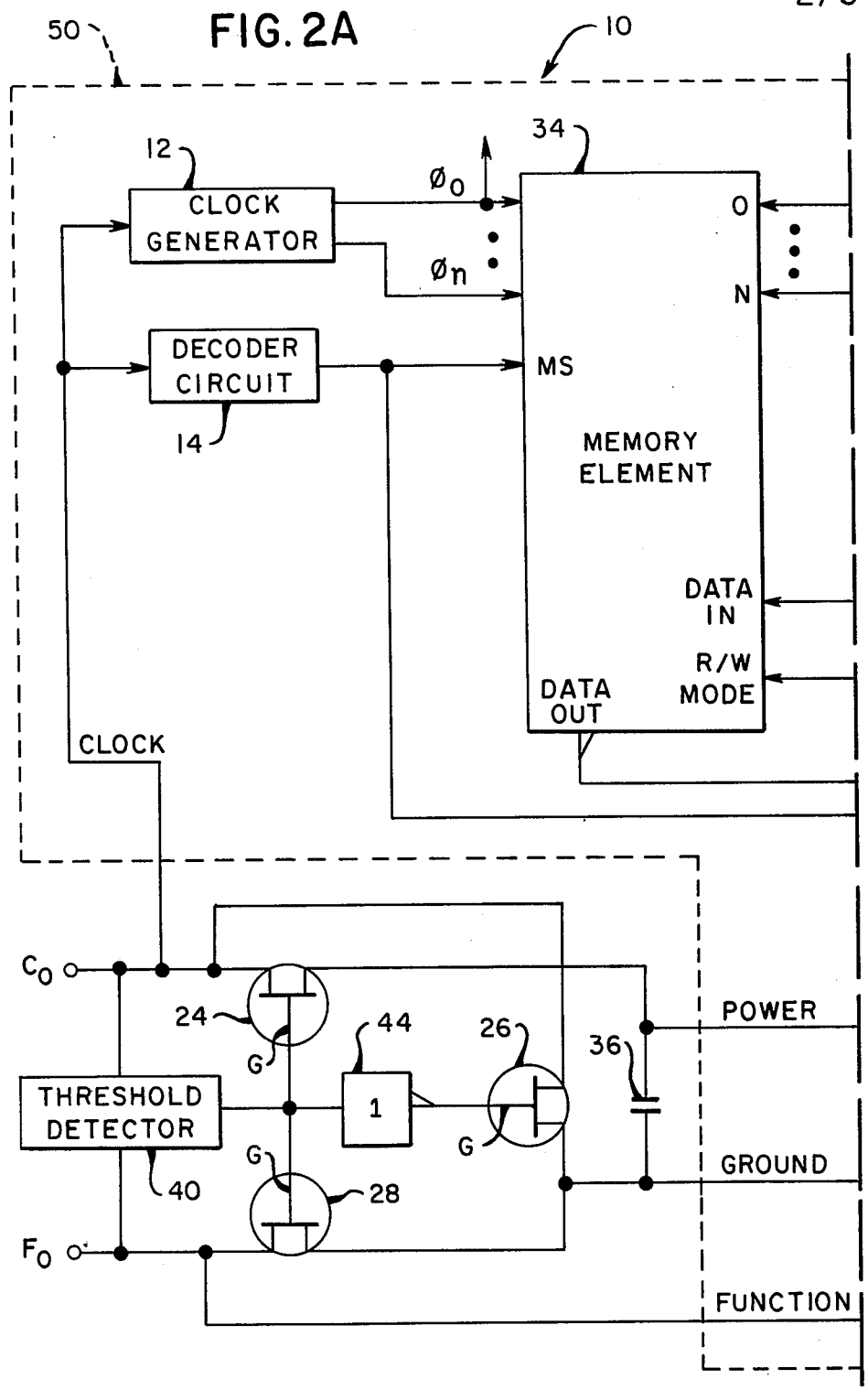

MEMORY DEVICE HAVING A REDUCED NUMBER OF PINS

BACKGROUND OF THE INVENTION

The present invention is directed to a circuit for minimizing the number of electrical terminals or pins on a memory device. More particularly, the present invention is directed to the elimination of external power and ground pins on such a device.

The commercial success of many high access speed static memory devices for use in computers is largely dependent on the bit density of such devices, so that the cost per bit is comparable to that of conventional low access speed dynamic memories, such as magnetic disks, drums, tapes, and the like.

One approach to increasing bit density is to decrease the number of pins on, and hence the number of connections to, the memory device so more devices can be assembled on a given circuit board area.

In U.S. application Ser. No. 812,290, filed 7-1-77 entitled "A Minimum Pin Memory Device", which application is assigned to the same assignee as the present application, pin or terminal reduction is accomplished for a memory device by merging the functions on various pins. A clock terminal provides both a synchronizing and a memory select function. A function terminal is bi-directional and provides memory mode selection, memory address and data input and output functions.

In U.S. application Ser. No. 895,329, filed 4-11-78 entitled "Memory Device Having a Minimum Number of Pins", which application is also assigned to the same assignee as the present, application circuit is provided within a memory device for eliminating the external power and ground pins on the device. The circuit includes a counter for counting clock pulses received at one of two external pins, and after a predetermined number of pulses are counted, connecting the two external pins to the power and ground terminals of an internal power supply.

The subject matter of the present application provides an alternative approach to pin reduction and the elimination of external power and ground pins in a memory device.

SUMMARY OF THE INVENTION

In the present invention, pin reduction in a memory device is accomplished by merging the external power and ground terminals with external terminals providing other functions.

In accordance with the present invention, signal processing means, such as a rectification circuit, include threshold detection means that sense the difference in signal magnitude or voltage between signals applied at two external pins, and switching means, such as transistors which, when the difference in signal voltage reaches a predetermined maximum level, connect the two external pins to power and ground terminals of an internal power supply in the memory device.

In the preferred embodiment, pin reduction has been first accomplished in accordance with the technique described in the aforementioned U.S. application Ser. No. 812,290. Hence, the clocking signal received by the memory device at one pin or external terminal is coded to provide, in addition to the clocking or synchronizing function, a memory select function. A second pin or external terminal, referred to as the "function" pin, is bi-directional and receives a signal made of components that provide memory mode selection, memory address and data input and output functions. The signal component providing the date output function is, of course, internally generated since the signal component represents data held within the memory device. The clocking signal is in the form of periodic pulses that swing from ground to a predetermined positive voltage level. Te function signal is also in the form of pulses, although not necessarily periodic, that swing from ground to a positive voltage level. The information represented by the function signal can be clocked into the memory device when the clocking signal is low. A threshold detector senses the difference in voltages at the clock and function pins, and when such difference is at a maximum, operates switching transistors to connect the clock pin to the power input terminal of an internal power supply circuit within the memory device, and the function terminal to the ground input terminal of the internal power supply. A switching transistor is also provided for connecting the clock pin to the ground terminal of the internal power supply when a maximum difference is not detected, and the clocking signal is thus at ground level. As a consequence, a ground level signal is provided to the ground terminal of the internal power supply alternately by the clock and function pins, and pulse signals having a sufficient positive voltage are periodically supplied by the clock pin to the power terminal of the internal power supply.

It can thus be seen that one object of the present invention is to provide a memory device having a minimum number of external pins or terminals.

It is a further object of the present invention to eliminate the need for external power and ground pins on a memory device.

It is another object of the present invention to use the clocking signal provided to the memory device to also provide a power signal to such memory device.

Still a further object of the present invention is to provide a memory device having only two external pins, with such pins providing power and ground, as well as memory device selection, memory mode selection, memory address and data input and output functions.

These and other objects of the present invention will become more apparent when taken in conjunction with the following description and the attached drawings.

BRIEF DESCRIPTION OF THE DRAWINGS

FIG. 1 is a perspective view of a memory device in the form of an integrated circuit structure and constructed in accordance with the present invention;

FIGS. 2a and 2b are, taken collectively, a circuit block diagram illustrating the memory device of FIG. 1; and FIGS. 3a and 3b are waveforms illustrating the operation of the memory device of FIGS. 1, 2a and 2b.

DESCRIPTION OF THE PREFERRED EMBODIMENT

Figure 2B:
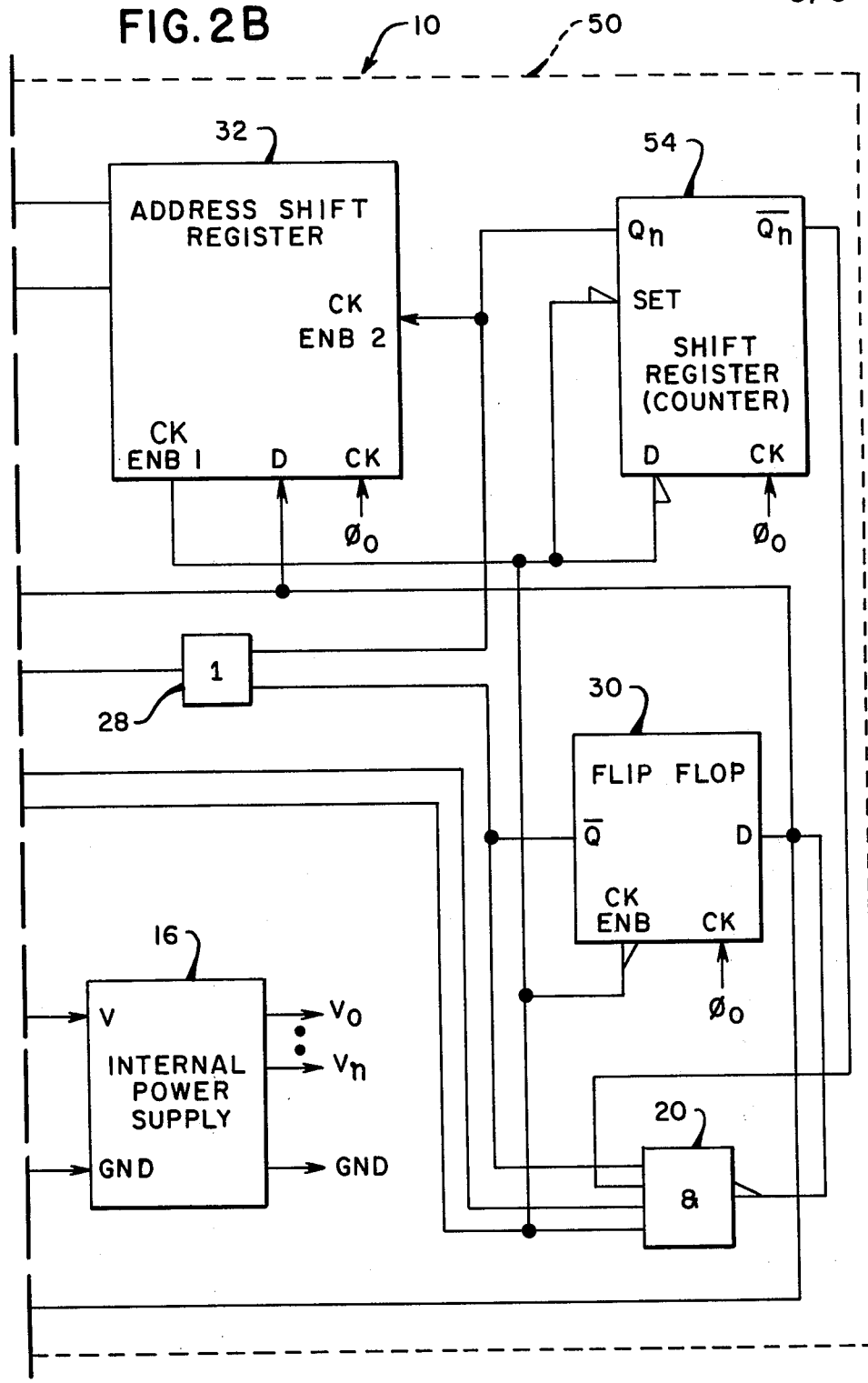

FIG. 1 illustrates a memory device 10 in the form of a monolithic integrated circuit structure having two external pins or terminals, labelled $C_0$ and $F_0$. The memory device 10 includes a memory element, such as a charge coupled device (CCD), and, as will be more fully described later, the $C_0$ and $F_0$ pins provide all the necessary inputs and outputs to the device 10 and the memory element therein.

Referring now to FIGS. 2a and 2b, the circuitry within memory device 10 is illustrated in block diagram form. The clock pin, $C_0$, is connected to a clock generator circuit 12, to a decoder circuit 14, to the power input terminal V of an internal power supply 16 by way of a field effect transistor 24, and to a ground or reference voltage input terminal GND of the internal power supply 16 by way of a field effect transistor 26. The function pin, $F_0$, is electrically connected to the ground input terminal GND of the internal power supply 16 by way of a field effect transistor 28, and to the output of a NAND gate 20, to the D input of a D-type flip-flop 30, to the D input of an address shift register 32, and to the DATA IN terminal of a memory element 34, which may be a CCD or some other type of memory element. A capacitor 36 is connected across the leads to the V and GND inputs of the internal power supply 16.

The decoder circuit 14 may be conventional circuit for detecting a change in clock pulse width, and may comprise generally a delay network and a flip-flop. A suitable decoder circuit could be of the type shown, for example, in greater detail in the previously mentioned application Ser. No. 812,290.

A threshold detector 40 is connected across the $C_0$ and $F_0$ pins, The threshold detector 40 senses the difference in the voltage levels of the signals applied to the $C_0$ and $F_0$ pins, and when a predetermined voltage level difference is sensed, the threshold detector supplies an enabling signal to gates G of the transistors 24 and 28 to cause them to become conductive. The output of the threshold detector 40 is also connected to the gate G of transistor 26 by way of an inverter 44 so that the transistor 26 is conductive during those periods when transistors 24 and 28 are not.

The threshold detector 40 is a circuit well known to those skilled in the art for receiving two signals, comparing the voltage level of the two signals and when the difference in voltage reaches a predetermined level, generating an appropriate signal. The threshold circuit could include, for example, a comparator circuit or a Schmitt trigger.

That part of the circuit in FIGS. 2a and 2b which is shown enclosed by broken lines 50 is essentially the memory device circuit disclosed in the previously mentioned application Ser. No. 812,290. Although a description of the circuit within the broken lines 50 will follow, reference can be had to such application for a more detailed description of the individual components therein and the operation thereof.

As is illustrated in FIGS. 2a and 2b, four signals are provided to the circuit components within the broken lines 50, such signals identified as CLOCK, POWER, GROUND, and FUNCTION. The CLOCK and FUNCTION signals come directly from the $C_0$ and $F_0$ pins, respectively. However, the POWER and GROUND signals, which are generally responsible for providing, as inputs to the internal power supply 16, the necessary operating voltages for each of the components within the memory device 10, are provided by rectifying the signals on the $C_0$ and $F_0$ pins, in a manner which will be described in greater detail below.

It should be noted that in the memory device 10, the signals on the $C_0$ and $F_0$ provide a total of eight functions; namely, power, ground, memory device selection, synchronizing (clocking), memory mode selection, memory address, data input and data output.

Referring now to FIGS. 3a and 3b, waveforms depicting the signals applied to the $C_0$ and $F_0$ pins are shown to illustrate the operation of the memory device 10. Turning first to FIG. 3a, the depicted waveforms illustrate a condition where the memory device has not been selected, and is referred to as a recirculation mode since data within the memory element 34 is being recirculated and refreshed as it is held ready for use. In this condition, uniformly spaced and relatively wide low logic level clock pulses are received on the $C_0$ pin, each cycle of the signal on the $C_0$ pin having a period designated $T_1$. The signal is carried to the clock generator 12 which, in response, generates the necessary clocking signals, designated $\phi_o$ through $\phi_n$, to the memory element 34, and to other components, as indicated, in the memory device.

During the recirculation mode illustrated in FIG. 3a, the necessary operating voltages, designated $V_o$ through $V_n$, and a ground signal, designated, GND, are also provided in the memory device 10 by the signals on the $C_0$ and $F_0$ pins. When the signal at $C_0$ is at its positive or "1" logic level, the $F_0$ signal will always be at ground or at a "0" logic level, since data or information is only transferred to or from the memory element 34 during the low or "0" logic level clock pulse of the synchronizing signal on the $C_0$ pin. When the signal on $C_0$ goes low, the signal on $F_0$ could either be at a "1" or "0" level. This is indicated by the shaded portions of the waveform in FIG. 3a, since, in a recirculating mode, the memory device 10 with respect to the data or information on the $F_0$ terminal is in a "DON'T CARE" condition. Since the external data line to the $F_0$ pin could be common to memory devices other than the one illustrated, the signal on $F_0$ could represent data being delivered to some other selected memory device.

Referring still to FIG. 3a, as the signal at the $C_0$ pin rises to the "1" level, the threshold detector 40 senses the maximum voltage difference between the voltages at the $F_0$ and $C_0$ pins, and its output provides an enabling signal ("1" logic level) to the gate G of each of the transistors 24 and 28 to thereby cause those transistors to become conductive. As a result, the positive power voltage level at the $C_0$ pin is applied to the power terminal V of the internal power supply 16, and the ground or reference voltage level signal at the $F_0$ pin is applied to the ground terminal GND of the internal power supply 16. During such time, the output of inverter 44 is at a "0" logic level signal and the transistor 26 is nonconductive.

When the signal applied to the $C_0$ signal drops to ground or "0" logic level, the voltage difference between the signals at the $C_0$ and $F_0$ terminals is no longer sufficient to enable the output of the threshold detector 40, and transistors 24 and 28 become nonconductive. The output of the inverter 44 goes to a "1" logic level, and is applied to the gate G of transistor 26, which causes transistor 26 to become conductive and connect the ground or reference voltage level signal at the $C_0$ pin to the GND terminal of the power supply 16.

From the foregoing, it can be seen that the internal V terminal of the power supply 16 receives periodic positive pulses and the internal ground or GND terminal of the power supply receives a continuous or nearly continuous ground level signal. The capacitor 36 connected across the leads to the V and GND terminals of the internal power supply 16 helps maintain a relatively steady or constant voltage across the terminals V and GND.

It should be noted that in order to maintain a proper ground for the circuit components, it is desirable for the signal at the $F_0$ terminal to remain at ground level during the entire time that the signal at the $C_0$ terminal is at its high or "1" level.

Referring now to FIG. 3b, there is illustrated the condition where the memory device 10 and its memory element 34 have been selected for either reading or writing data. The memory device is selected by decreasing the width of the low logic level clock pulse applied at the $C_0$ pin. Since data is read or written at a much faster rate than it is shifted during the recirculation mode, the frequency of the clock pulses also increases, and hence each cycle has a decreased period designated $T_2$. It should be noted that the frequency of the clocking signal in FIG. 3B is shown at twice the frequency as in the recirculation mode of FIG. 3A. The actual read or write frequency could be a much higher multiple of the recirculation frequency. However, if the data line to the $F_0$ pin is common to memory device 10 and other memory devices, having a read or write frequency which is a multiple of the recirculation frequency is preferable since the positive clock level, whether in the read or write mode or the recirculation mode, should always coincide with the ground level voltage between data pulses in the signal on the $F_0$ pin. If the data line to the $F_0$ pin is not a common line, the frequencies during the read or write mode and the recirculation mode could, of course, be totally independent of each other.

As illustrated in FIG. 3b, to select the memory device 10 the clock pulse at $C_0$ narrows during the period identified as "MEMORY SELECT" and the decoder circuit 18 senses the change in pulse width and provides a memory select (MS) signal (logic level "1") to the memory element 34, to one input of the NAND gate 20, to the CK ENB terminal of the flip-flop 30, the CK ENB 1 terminal of the address shift register 32, and to the D and SET inputs of a shift register or counter 54.

During the "MODE SELECT" period which coincides with the clock cycle immediately after "MEMORY SELECT", the signal on the $F_0$ pin either is at a "0" memory level or goes to a "1" logic level to indicate the memory mode selection, i.e., whether the memory device 34 is selected for reading or writing, with, for example, the "0" logic level indicating a read mode and the "1" logic level indicating a write mode. The mode select signal at the $F_0$ pin is applied to the D input of the flip-flop 30 and with the memory select (MS) signal generated by the decoder circuit 14 and delivered to the CK ENB (clock enable) terminal of flip-flop 30, the mode select signal (either a "0" or a "1" level) is latched into the flip-flop 30 and appears at the $\bar{Q}$ output when the next clock pulse of the clocking signal $\phi_o$ is received at the CK (clock) input of the flip-flop 30.

After the MS signal is received at the SET and D inputs of the shift register 54, the shift register 54 begins to count to a number corresponding to the number of bits $A_o$ through $A_n$ received on the $F_0$ pin for the address which is to be read from or written into the memory element 34. When the proper number of bits has been counted by the shift register 54, an enabling signal (logic level "0") from the $Q_n$ output of shift register 54 is applied to the CK ENB 2 terminal of address shift register 32 and to one input of an OR gate 28. At such time, the OR gate 28 passes the mode select signal from the $\bar{Q}$ output of flip-flop 30 to the R/W mode terminal of the memory element 34 and the pertinent address data bits ($A_o$ through $A_n$) which have been serially received at the D input of the address shift register 32 are presented in parallel form to the address inputs 0 through N of the memory element 34.

If data bits ($D_o$ through $D_n$) on the $F_0$ pin are to be written into the memory element, such data is presented serially to the DATA IN terminal of the memory element and then stored at the memory address specified by the address inputs 0 through N. If data is to be read from the memory device 34, the data bits ($D_o$ through $D_n$) in the memory device at the address specified by the address inputs 0 through N are presented in serial fashion at the DATA OUT terminal of memory element 34 and carried to the $F_0$ pin by way of the NAND gate 20.

Although the operation of the circuit components within the broken lines 50 have been described briefly, as mentioned earlier, a more detailed discussion can be obtained by reference to the aforementioned application Ser. No. 812,290.

From the above, it can be seen that a memory device in the form of an integrated circuit structure is provided having only two pins or external terminals. The signals provided at the two pins are coded to provide synchronizing, memory select, mode select, memory address, data input and data output functions, and the signals are rectified to provide the power and ground signals to the input terminals of the internal power supply within the memory device. It should be understood, of course, that signal coding techniques other than those described above could be used for providing the memory select, mode select, memory address, and data input and output functions, as long as the signals can be rectified to develop a sufficient voltage difference across the power and ground terminals of the internal power supply.

Although a specific embodiment of the invention has been shown in detail, it will be understood by those skilled in the art that various changes in form and details may be made therein without departing from the spirit and scope of the invention.

What is claimed is:

1. A memory device requiring a power signal and a reference signal, comprising:
   a memory element;
   at least two external terminals, one of said external terminals for receiving a first signal and the other of said external terminals for receiving a second signal;
   threshold detection means operatively connected to said external terminals for sensing when the difference in magnitude of said first and second signals reaches a predetermined level and in response thereto providing an enabling signal at its output; and
   means for receiving said enabling signal and in response thereto causing said power and reference signals to be provided by said first and second signals.

2. The memory device of claim 1, wherein said first signal includes substantially periodic clock pulses and wherein said memory device further comprises an internal power supply having a power terminal for receiving said power signal and a reference terminal for receiving said reference signal and capacitor means connected across the leads to said power and reference terminals of said internal power supply.

3. In a memory device having at least two external pins and requiring a power signal and a ground level signal:

signal processing means for receiving a first signal applied to one of said external pins and a second signal applied to the other of said external pins, said first and second signals providing functions other than power and ground signal functions, and for processing said first and second signals to provide said power and ground level signals, said processing means including a threshold detector operatively connected to said two external pins for generating an enabling signal when the difference in the magnitude of said first and second signals reaches a predetermined level.

4. The memory device of claim 3, wherein said first signal includes substantially periodic clock pulses and wherein said processing means comprises rectification means and further includes a capacitor and switching means for receiving the enabling signal from said threshold detector and in response thereto connecting the one of said external pins to said capacitor so that a relatively constant voltage is maintained across said capacitor to provide said power and ground level signals.

5. In a memory device having an internal power supply for receiving a power signal and a ground level signal;
   a first pin for receiving a first, substantially periodic signal;
   a second pin for receiving a second signal; and
   rectification circuit means, including a threshold detector operatively connected to said first and second pins for receiving said first and second signals and for sensing the difference in voltage of said first and second signals, and when a maximum voltage difference level is sensed, for causing said first and second signals to provide said power signal and said ground level signal to said internal power supply.

6. The memory device of claim 5, wherein said threshold detector generates an enabling signal when the maximum difference level is sensed, and wherein said rectification circuit means further includes switching means for receiving said enabling signal and in response thereto connecting said first pin to a first, power input terminal of the internal power supply, and said second pin to a second, ground input terminal of said internal power supply.

7. The memory device of claim 6, wherein said switching means includes a first and a second transistor for receiving said enabling signal, said first transistor interposed between said first external pin and said first input terminal of said internal power supply and said second transistor interposed between said second external pin and said second input terminal of said internal power supply.

8. The memory device of claim 7, wherein said switching means further includes a third transistor for receiving said enabling signal by way of an inverter and being interposed between said first external pin and said second input terminal of said internal power supply so that said first pin is connected to said second terminal when the maximum difference level is not sensed by said threshold detector.

9. The memory device of claim 5, wherein said rectification circuit means further includes capacitor means connected across said first and second input terminals of said internal power supply so that a substantially constant voltage difference is maintained across said first and second input terminals of said internal power supply.

10. In a memory device in the form of an integrated circuit structure:
    a first pin for receiving a first synchronizing signal;
    means for detecting a change in said first synchronizing signal for enabling said memory device;
    a second pin for receiving a second signal, including memory address, data input, and internally-generated data output component signals;
    means for mode selecting said memory device in response to a mode select signal at one of said first and second external pins;
    an internal power supply for receiving a power signal and a ground level signal; and
    rectification means for receiving the first signal and the second signal on said first and second external pins and in response thereto providing said power signal and said ground level signal to said internal power supply, said rectification means including switching means and threshold detector means, said threshold detector means for providing an enabling signal when a predetermined difference in voltage between said first and second signals is sensed, said switching means for receiving said enabling signal and in response thereto for operatively connecting said first and second external pins to said power supply.

11. A method for eliminating the external power and ground terminals on a memory device, comprising:
    providing a first signal on a first external pin having periodic pulses;
    providing a second signal on a second external pin which periodically is at a ground level voltage; and
    sensing the difference in voltage level of said first and second signals, and when the difference reaches a predetermined level, using said first and second signals to provide a power and a ground level signal for said memory device.

12. The method of claim 11, wherein said step of providing a first signal includes alternating said first signal between a power level voltage and a ground level voltage, and wherein said step of providing a second signal includes providing said second signal at its ground level voltage when said first signal is at its power voltage level.

* * * * *